United States Patent

Sachs et al.

[11] Patent Number: 5,807,437
[45] Date of Patent: Sep. 15, 1998

[54] THREE DIMENSIONAL PRINTING SYSTEM

[75] Inventors: Emanuel Sachs, Somerville; Alain Curodeau; Tailin Fan, both of Cambridge; James F. Bredt, Watertown; Michael Cima, Lexington; David Brancazio, Cambridge, all of Mass.

[73] Assignee: Massachusetts Institute of Technology, Cambridge, Mass.

[21] Appl. No.: 596,707

[22] Filed: Feb. 5, 1996

Related U.S. Application Data

[63] Continuation of Ser. No. 19,470, Feb. 18, 1993, abandoned, which is a continuation of Ser. No. 447,677, Dec. 8, 1989, Pat. No. 5,204,055.

[51] Int. Cl.$^6$ .............................. B05C 5/00; B05C 11/00; B05B 5/00; B32B 31/00
[52] U.S. Cl. ......................... 118/688; 118/712; 118/697; 118/620; 118/315; 118/323; 347/1; 347/82; 239/690; 239/695; 156/64; 156/356; 264/113; 264/128
[58] Field of Search ..................... 118/669, 688, 118/697, 663, 623, 624, 625, 636, 313, 315, 323, 620, 712; 347/82, 78, 79, 80, 1; 239/690, 695, 698; 156/64, 356; 264/113, 255, 128; 425/427

[56] References Cited

U.S. PATENT DOCUMENTS

| | | | |
|---|---|---|---|
| 2,985,939 | 5/1961 | Brockman | 25/157 |
| 3,868,267 | 2/1975 | Gazza et al. | 117/22 |
| 3,999,188 | 12/1976 | Yamada | 347/80 |
| 4,122,458 | 10/1978 | Paranjpe | 346/75 |
| 4,129,875 | 12/1978 | Ito et al. | 347/80 |
| 4,158,204 | 6/1979 | Kuhn et al. | 347/78 |
| 4,247,508 | 1/1981 | Housholder | 264/219 |

(List continued on next page.)

FOREIGN PATENT DOCUMENTS

| | | |
|---|---|---|
| 0431924A2 | 6/1991 | European Pat. Off. . |
| 0446934A2 | 9/1991 | European Pat. Off. . |
| 0470705A2 | 12/1992 | European Pat. Off. . |
| 549132 | 4/1979 | Japan . |
| 2111528 | 4/1990 | Japan . |
| WO90/03893 | 4/1990 | WIPO . |
| WO92/20505 | 11/1992 | WIPO . |

OTHER PUBLICATIONS

Abstract, from Japanese Patent No. A 4061328, published Jun. 15, 1992.
Abstract, from Japanese Patent No. A 2307737, published Mar. 6, 1991.
Database WPI, Section PQ, Week 9103, Derwent Publications Ltd., London, GB; Class P, p. 43, AN 91–020238, & SU–A–1 563 787 (Suchkov, A.G.), 15 May, 1990.

(List continued on next page.)

*Primary Examiner*—Steven P. Griffin
*Attorney, Agent, or Firm*—Steven J. Weissburg

[57] ABSTRACT

A system for producing three dimensional components by bonding together successive layers of a porous material with droplets of a binder material. A binder printhead has an array of nozzles which controllably supply jets of binder material droplets to the layers of porous material. The printhead is scanned in a raster scan fashion over each layer of porous material along a first scan axis in one direction to provide first fast scanning paths of droplets. The printhead is then moved laterally of such one direction and is then moved along the fast-scan axis in the opposite direction to provide second fast scanning paths of droplets which are interlaced with the first scanning paths. The supply of the droplets to the porous material can be controlled so as to control the overlapping thereof to produce various desired surface and interior characteristics of the components.

44 Claims, 7 Drawing Sheets

U.S. PATENT DOCUMENTS

| | | | |
|---|---|---|---|
| 4,294,805 | 10/1981 | Hodgson et al. | 423/4 |
| 4,420,446 | 12/1983 | Wieder et al. | 264/40.6 |
| 4,575,330 | 3/1986 | Hull | 425/174.4 |
| 4,636,341 | 1/1987 | Murley | 264/37 |
| 4,642,653 | 2/1987 | Ito et al. | 346/1.1 |
| 4,665,492 | 5/1987 | Masters | 364/468 |
| 4,675,216 | 6/1987 | DuForest et al. | 427/56.1 |
| 4,791,022 | 12/1988 | Graham | 428/324 |
| 4,791,434 | 12/1988 | Wills | 239/690 |
| 4,818,562 | 4/1989 | Arcella et al. | 427/53.1 |
| 4,863,538 | 9/1989 | Deckard | 156/62.2 |
| 4,929,402 | 5/1990 | Hull | 264/22 |
| 4,935,055 | 6/1990 | Aghajanian et al. | 164/66.1 |
| 5,016,683 | 5/1991 | Latka | 141/1 |
| 5,053,090 | 10/1991 | Beaman et al. | 156/62.2 |
| 5,059,266 | 10/1991 | Yamane et al. | 118/313 |
| 5,121,329 | 6/1992 | Crump | 364/468 |
| 5,136,515 | 8/1992 | Helinski | 364/468 |
| 5,147,587 | 9/1992 | Marcus et al. | 264/22 |
| 5,204,055 | 4/1993 | Sachs et al. | 419/2 |

OTHER PUBLICATIONS

Sweet, Richard G., "High Frequency with Electrostatically Deflected Ink Jets", The Review of Scientific Instruments, 36:2, pp. 131–136, 1965.

Carl R. Deckard et al., "Solid Freeform Fabrication and Selective Powder Sintering", Department of Mechanical Engineering, University of Texas at Austin, undated.

Deckard, et al. "Solid Freeform Fabrication and Selective Powder Sintering", NAMRAC Proceedings, Symposium #15, undated.

Kodama, H., "Automatic Method for Fabricating a Three–Deminsional Plastic Model with Photo–Hardening Polymer", Review of Scientific Instruments, vol. 52, No. 11, Nov. 1981.

Wohlers, Terry, "Creating Parts by the Layers", Cadence, Apr., 1989, pp. 73–76.

THREE DIMENSIONAL PRINTING SYSTEM

RELATED DOCUMENTS

This application is a continuation of applicaton Ser. No. 08/019,470 filed Feb. 18, 1993, now abandoned, which is a continuation of co-assigned U.S. Pat. application Ser. No. 07/447,677, filed on Dec. 8, 1989, in the names of Emanuuel M. Sachs, Michael J. Cima, John S. Haggerty, and Paul A. Williams, entitled THREE-DIMENSIONAL PRINTING TECHNIQUES, issued on Apr. 20, 1993 as U.S. Pat. No. 5,204,055.

INTRODUCTION

This invention relates generally to the production of components directly from a computer model by three dimensional printing techniques, using a layered process, and, more particularly, to the production of components at a high rate in a manner such that the quality of certain properties of the components, and especially the surface finishes thereof, can be controlled.

BACKGROUND OF THE INVENTION

Components can be created directly from a computer model using such three dimensional printing processes which can be defined as processes that construct objects in layers using a computer model of the objects. Exemplary processes of this type are described, for example, in U.S. Pat. Application of Sachs et al., Serial No. 07/447,677, filed on Dec. 8, 1989, now U.S. Pat. No. 5,204,055, issued on Apr. 20, 1993, which application is incorporated by reference herein. As described in such application, a component can be produced by spreading powder (or other porous material) in a layer and then depositing a further material, e.g., a binder material, at specific regions of a layer as determined by a computer model of the component. The further material acts to bind the powder both within the layer and between layers. This process is repeated layer after layer until all layers needed to define the components have been printed.

The fundamental requirement that must be satisfied if three dimensional printing techniques are to be capable of manufacturing large quantities of product is to simultaneously satisfy the need to produce components at high rate and with high quality. Control of the quality of the part includes the control of dimensions and the control of its surface finish. Another aspect of component quality control is the control of the internal structure of the component so as to yield certain desired properties thereof, including a desired isotropic nature of the part, or a desired anisotropic nature of the part A.

The rate at which parts can be created in three dimensional printing processes can be understood by recognizing that, typically, each cubic centimeter of binder that enters the powder bed binds approximately 1 cubic centimeter of powder and creates a portion of the part of approximately 2 cubic centimeters in volume. Thus, the overall volume of a part created is roughly twice the volume of binder deposited, the total volume varying depending on the type of powder used, so that it can be more or less than twice the volume of binder deposited. The attainment of a high production rate in a three dimensional printing process thus depends on depositing the binder at a high volume flow rate.

The binder can be applied using ink-jet printing techniques and the aforesaid Sachs et al. patent describes a configuration of an apparatus where the device which delivers the binder is moved over the bed of porous material in a raster scan motion. Such configuration of a three dimensional printing machine, while not the only one possible, forms the principal basis for the invention described herein.

When the binder is delivered using ink-jet printing techniques, each droplet of binder enters the powder bed and joins together a number of powder particles to form a generally spherical "primitive" building element. FIG. 1 shows a micrograph of an exemplary spherical "primitive" element which is about 120 microns in diameter. The primitive shown therein was made by printing a single 80 micron diameter droplet of binder into a bed of powder. The binder used was colloidal silica and the powder was an alumina powder having an average particle size of 30 microns. As successive droplets are deposited, these spherical building elements overlap to form the finished component. The surface finish of the finished part is largely determined by the placement of the individual droplets and how they overlap. FIG. 2 shows a portion of a component where five droplets, shown in a simplified diagrammatic fashion, have been printed with some, relatively small, overlap. In FIG. 2, each of the circles represent diagrammatically a generally spherical building element of the type shown in FIG. 1 which results from an individual binder droplet.

The surface of the printed part is defined by the surface 13, which can be seen to be somewhat rough due to the nature of the contours of the primitives. By contrast, FIG. 3, shows diagrammatically a portion of a component comprising a plurality of spherical elements which have been printed with a higher degree of overlap with the result that the surface 15 is relatively smoother than the surface 13. The problem of creating high quality parts at a high production rate can be seen to be a problem of how to deposit droplets at a relatively high rate while retaining the ability to determine and control the location of the droplet placement.

The requirements for a high production rate with high quality in a three dimensional printing process provide a significantly different challenge than the conventional printing of ink on paper. One significant difference is that in printing on paper it is the general practice to move the paper at high speeds past a stationary printhead. In three dimensional printing it is preferable, and often necessary, to move the printhead past a stationary bed of porous material because the bed of porous material is often relatively large and massive. Another difference is that, in conventional printing of ink on paper, the droplet separation needed to achieve high resolution printing is considered to be about 300 dots per inch (dpi). Thus, if the droplet position can be effectively controlled to occur at intervals of $\frac{1}{300}$ inch, or approximately 85 microns, high resolution printing can be accomplished. However, such a 300 dpi droplet placement would be quite insufficient for the creation of three dimensional components. First, a 300 dpi placement would mean that the dimensions of the three dimensional object could only be controlled to within ±85 microns. Second, the surface finish of the object would be quite rough. For example, if the primitives of FIG. 2 represented primitives of 120 micron diameter and are placed 85 microns apart, the resulting surface would have a root-mean-square (RMS) roughness of approximately 6.0 microns and would result in a fairly rough surface. In fact, then the creation of components and surfaces in three dimensional printing processes is more complex than the situation represented by FIGS. 2 and 3 in that it is a 3-D problem, while conventional printing of ink on paper is a 2-D problem. Thus, in three dimensional printing, the placement of droplets must satisfy the requirement that the overlap between droplets must serve to bind together a self-supported component in three dimensions. In contrast, in conventional printing of ink on paper, only a 2-D image needs to be defined, and further, the paper itself provides the physical support for the image.

BRIEF SUMMARY OF THE INVENTION

In order to achieve high quality printing at a high rate in accordance with the invention, a multiple array of on-off controlled nozzles is scanned over the surface of a bed of porous material in multiple passes using an interlacing of the printed lines which deposit the binder thereon.

A further method for achieving the fine drop placement resolution required is to utilize an array of proportionally deflected jets disposed so that at least a component of the deflection is perpendicular to the direction of fast scan of the raster. The use of proportional deflection permits the edges of an object to be contoured to create smooth surfaces or to create selected patterns which are used to fill the interiors of components.

The accuracy of drop placement is maintained by an on-line measurement of the position and velocity, or time of flight, of the jets so that an adjustment of the data file which defines the model of the component being made can be made to compensate for any changes that may be needed.

BRIEF DESCRIPTION OF THE DRAWINGS

The invention can be described in more detail with the help of the accompanying drawings wherein.

DESCRIPTION OF THE PREFERRED EMBODIMENTS

Figure 4:
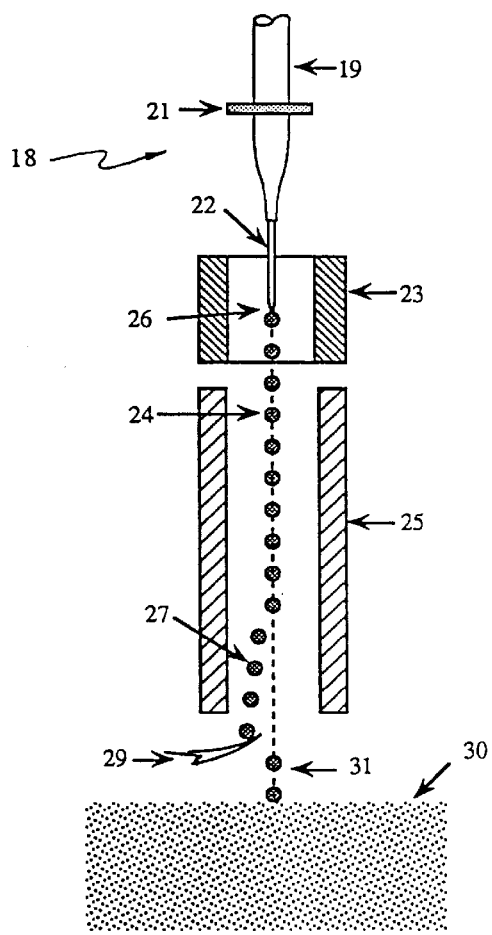
FIG. 4 shows a schematic illustration of an exemplary on-off continuous-jet printhead.

In an exemplary embodiment of the invention, continuous-jet ink-jet printing technology is used to deliver the binder to the bed of porous material. Continuous-jet technology is known to the art and FIG. 4 shows a diagram of a suitable means 18 comprising a nozzle 19 and a piezo-ceramic element 21 which represents an exemplary continuous-jet structure where the control of the droplets supplied therefrom is arranged to be controlled in an on/off manner. A pressurized fluid is emitted from a nozzle 19 in a continuous stream 22. Piezo-ceramic element 21 causes nozzle 19 to vibrate at a selected frequency so as to promote the breakup of the stream into droplets 24. The breakup happens at a particular position 26 along the length of the stream which is arranged to occur within a charging cell 23. When a voltage is applied to the charging cell to produce a voltage between the slightly conductive stream of liquid 22 and the charging cell, the droplets acquire a capacitively induced charge. When charged droplets 27 enter the high electric field between plates 25, the electric field being created by a constant voltage applied across such plates, the droplets are deflected and caught by a catcher element 29 and removed from the printhead. When no voltage is applied between the conductive stream of liquid and the charging cell, the droplets 31 are not charged and travel straight through and proceed to the target 30. In this manner, a continuous-jet printhead can be turned on and off by turning the voltage applied to the charging cell on and off. Since the charge on the droplets depends on the voltage applied between the droplet stream and the charging cell at the moment of break-off, the droplets may be individually controlled.

Figure 1:
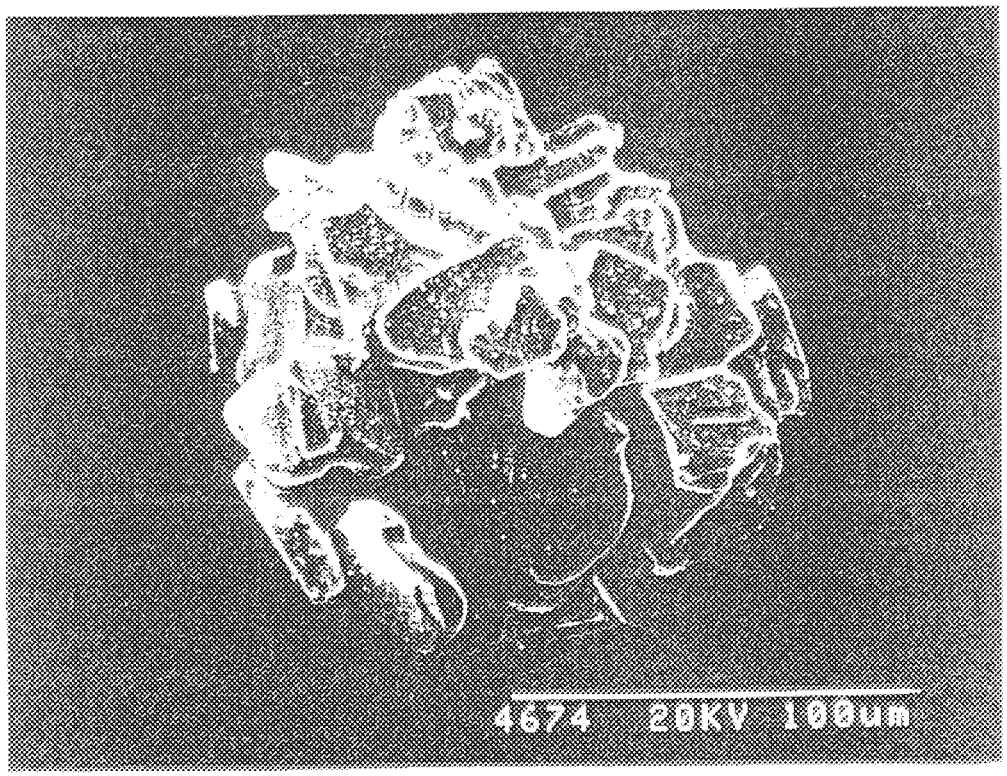
FIG. 1 shows a photomicrograph taken in a scanning electron microscope of an exemplary "primitive" element formed by the interaction of a single droplet of binder with powder.
Figure 2:
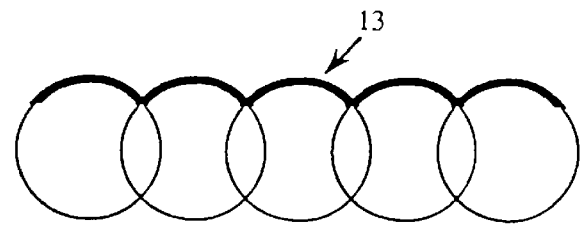
FIG. 2 shows a diagrammatic illustration of the nature of a surface defined by the overlap of droplets in a three dimensional printing process where the overlap is relatively coarse.
Figure 3:
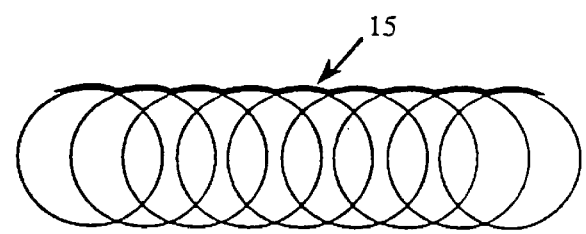
FIG. 3 shows a diagrammatic illustration of the nature of a surface defined by the overlap of droplets in a three dimensional printing process where the overlap is finer than in FIG. 2.
Figure 6A:
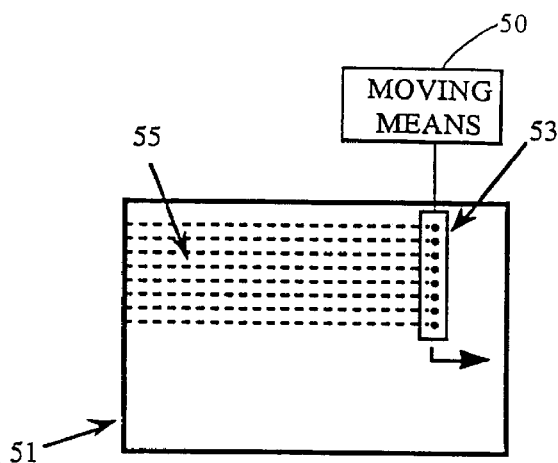
FIGS. 6(A) and 6(B) show an exemplary three dimensional printing pattern using an interlaced scan of an array of on-off jets;.
Figure 6B:
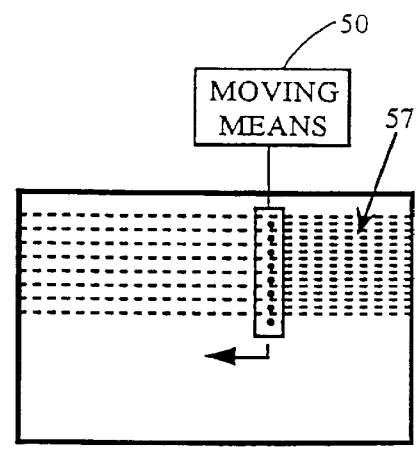
Figure 5:
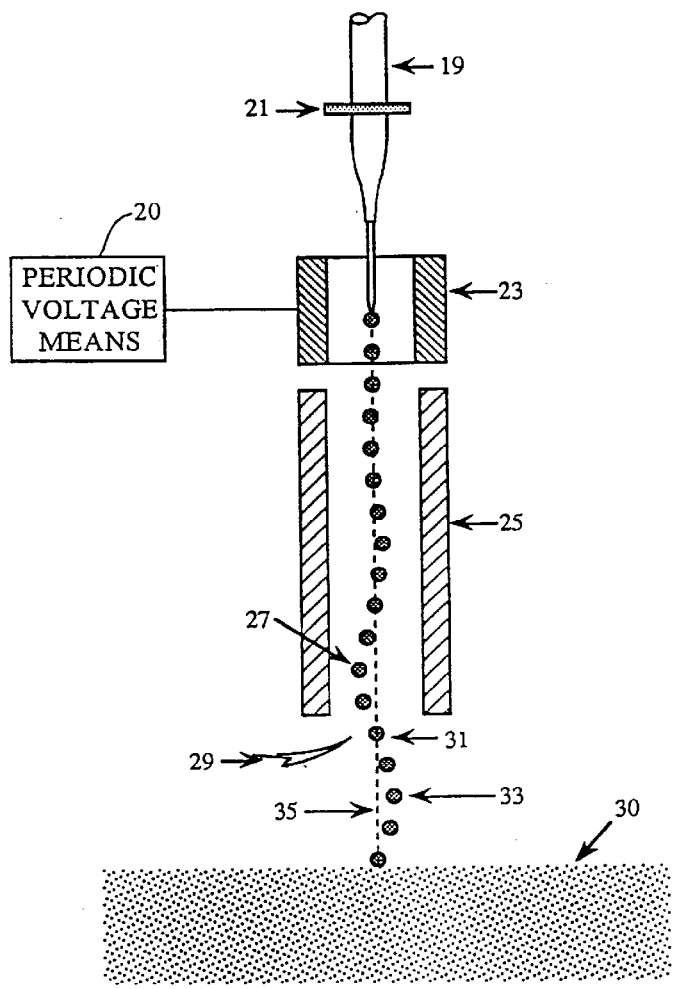
FIG. 5. shows a schematic illustration of an exemplary proportionally deflected continuous-jet printhead.

Continuous-jet printing may also be practiced in a proportional deflecting mode where the jet is deflected through a range of positions in order to deliver droplets at specified locations. In FIG. 5, for example, a sinusoidal voltage is applied to a charging ring 23 with the result that successive droplets are charged by different amounts in a sinusoidally varying pattern. As these droplets enter deflection plates 25, they are deflected by an amount proportional to their charge, i.e. the droplets are variably deflected. It should be noted that droplets can be charged either positively or negatively, resulting in deflections 27 and 33 on both sides of a line 35 which would be traveled by uncharged droplets. Controlling the voltage at the moment of break-off therefore allows for control of the landing position of the droplet at target 30. Applying a large voltage at the moment of break-off will cause a droplet to be deflected into a catcher element 29 as in the case of the on-off printhead of FIG. 4. One aspect of the current invention is to provide for precise drop placement with high deposition rates utilizing arrays of ink-jets, such as an array of binary continuous jets in a single printhead structure. In this embodiment, the printhead is scanned back and forth over the surface of the powder bed. Linear arrays of such binary continuous jets can be fabricated with nozzle spaces as small as 100 microns. Such linear arrays are fabricated by Diconix/Kodak Corporation of Dayton, Ohio. While arrays of such spacing are satisfactory for moderate resolution printing of ink on paper, 100 micron drop placement resolution is insufficient for three dimensional printing. In order to provide the drop placement resolution needed for high quality three dimensional printing, in accordance with the invention, multiple passes of the printhead are made over the surface of the powder bed using an interlacing of the binder print lines as shown in FIG. 6(A) and FIG. 6(B). In a typical application, a printhead structure having a linear array 53 of eight 50 micron diameter nozzles with 100micron spacing between nozzles can be employed. In FIG. (6A), the printhead is shown scanning from left to right over a bed 51 of porous material. Tracks 55 depict the impact areas of the deposited binder droplets.

In FIG. 6(B) the printhead 53 is shown as having been moved downward by one-half a nozzle spacing and then moved to scan from right to left. Tracks 57 depict the impact areas of both the left to right and the right to left passes of the printhead. Suitable means 50 can be used for moving the printhead in the desired raster scan manner as depicted in FIGS. 6(A) AND 6(B), as would be well known to those in the art.

In a typical application, it would be necessary to scan the printhead over the surface of the powder at a very high rate in order not to provide excessive binder to the powder bed which would result in an undesired bleeding of the binder in the powder. For example, if a layer of 200 microns thickness were being printed, the desired amount of binder per unit of deposition would be approximately 0.01 $cm^3/cm^2$. This amount of binder would fill up the void space in a bed of powder for a typical void space of 50%. Typically, the stream exiting from a 50 micron diameter nozzle would create 80 micron droplets at a rate of approximately 60 kilohertz. If the nozzle spacing is 100 microns and one interlacing pass is made, as shown in FIG. 6(B), the printhead would have to traverse at a speed of approximately 3.0 meters/second. This speed would result in the deposition of droplets at spacings of 50 microns along the direction of fast axis travel. Droplets would then be deposited on a roughly square array of 50 microns on a side, leading to material properties that are similar in the two directions within a printed layer. If the speed were lower than 3.0 meters/sec and all droplets were printed, too much binder would be deposited and bleeding would result. Alternatively, a lower traverse speed could be used if not all droplets were printed. A similar interlaced raster pattern could be created with a printhead that delivered droplets with on-off control by drop-on-demand printhead technology.

Figure 7A:
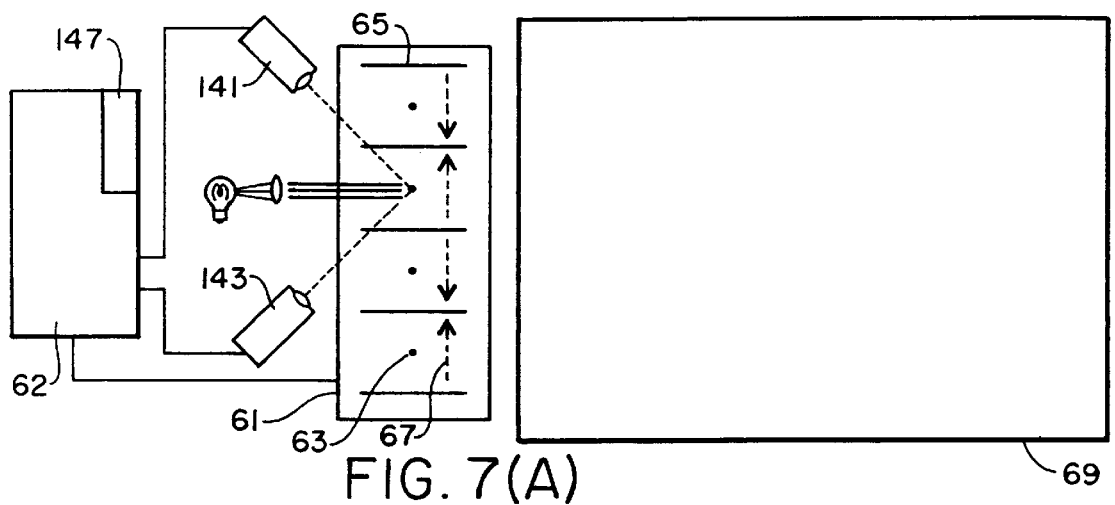
FIGS. 7(A) through 7(C) show an exemplary three dimensional printing pattern using an array of proportionally deflected jets.

Another embodiment of the current invention utilizes an array of proportionally deflected jets. In this case, the array of proportionally deflected jets is again scanned back and forth over the surface of the powder bed. The proportional deflection of the jet allows for a precise placement of the droplets in the powder bed. FIG. 7(A) shows an exemplary printhead structure 61 under the control of a controller 62 as is known in the art having a linear array of four nozzles 63 oriented perpendicular to the direction of fast scan of a raster pattern over a print area 69. Each jet is located within a set of deflection plates 65 so that the jet may be proportionally deflected along the direction of the linear array and perpendicular to the direction of fast scan of the printhead. The polarity of the plates 65 is alternated with the result that the electric field, represented by arrows 67 alternates between adjacent plates. Typically, the jet diameter might be 50 microns and the jets might be 3 millimeters apart. It is understood that for the purposes of illustration only, the scale used in FIG. 7(A) is not exact, but is meant to show that the spacing between jets is typically much larger than the jet diameter. Because of the need to dispose the jets between a pair of plates 65, it is difficult to have the spacing between jets very much smaller than 3 millimeters.

Figure 7B:
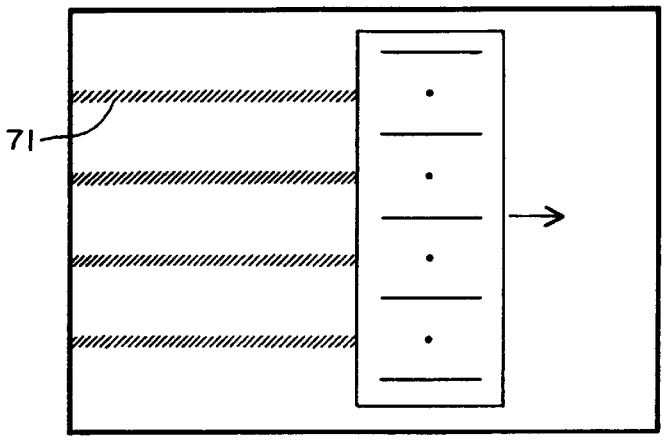
Figure 7C:
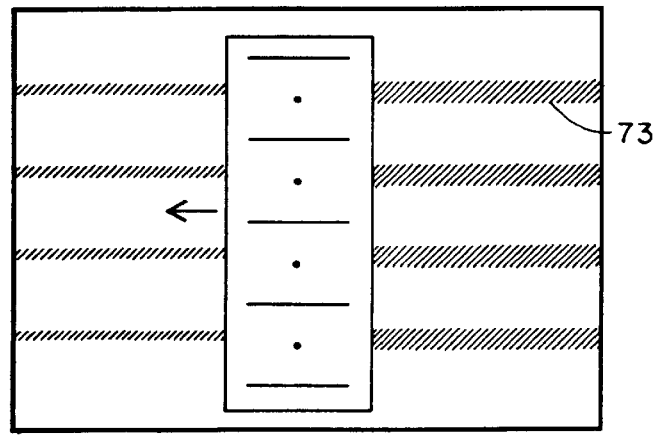

The deflection of the jets can be such as to cover the full range of distance between adjacent jets so that the entire area 69 can be printed with one pass, i.e. the deflection is variable. However, when a jet is deflected through a relatively large angle, errors in jet deflection can be difficult to control. These errors include both aerodynamic errors and electrical errors relating to the charging of the droplets. Thus, it is preferable, in accordance with the invention, to use only a relatively small amount of deflection of the jet so as to retain good accuracy in the droplet placement. In such a case, a single pass of the printhead does not cover the full area so that an interlacing scan pattern is needed. As an example, a single jet might be deflected so as to cover a printing area of 200 microns in width, so that 15 interlaced patterns would then allow for a complete printing of areas with an array having a 3 mm jet spacing. FIG. 7(B) shows the printhead 61 traveling from left to right, each proportionally deflected stream covering a relatively narrow path 71 as the printhead travels. FIG. 7(C) shows the printhead having been displaced downward and traveling from right to left and depositing binder over the lower portion of the path 73. It should be noted that the deflection can be to both sides of the position defined by an uncharged droplet, as was discussed in the context of FIG. 5. Alternatively, the deflection can be just to one side of the position defined by an uncharged droplet. In the latter case, it is possible to configure the printhead to catch uncharged droplets, while in the former case, uncharged droplets will be printed.

The use of proportional deflection allows for very fine control over the drop placement position in a direction perpendicular to the direction of fast scan of the raster. Another advantage of the use of proportional deflection is that the scanning speed of the printhead can be substantially reduced. This has the beneficial effect of providing finer resolution of drop placement along the direction of fast scan of the raster as well as making the equipment easier to fabricate. The finer resolution along the fast axis may be understood by noting that the requirement for 3-D printing is to deposit a specified amount of binder per unit area of printing for any particular layer thickness. As the binder droplets are displaced lateral to the fast axis, an individual stream covers more area. As a result, the fast axis can be slowed down. Since the droplet generation rate for a given nozzle configuration is fixed, a slower fast axis travel results in a higher number of droplets per unit length along the fast axis with the consequence of providing finer resolution.

Figure 8A:
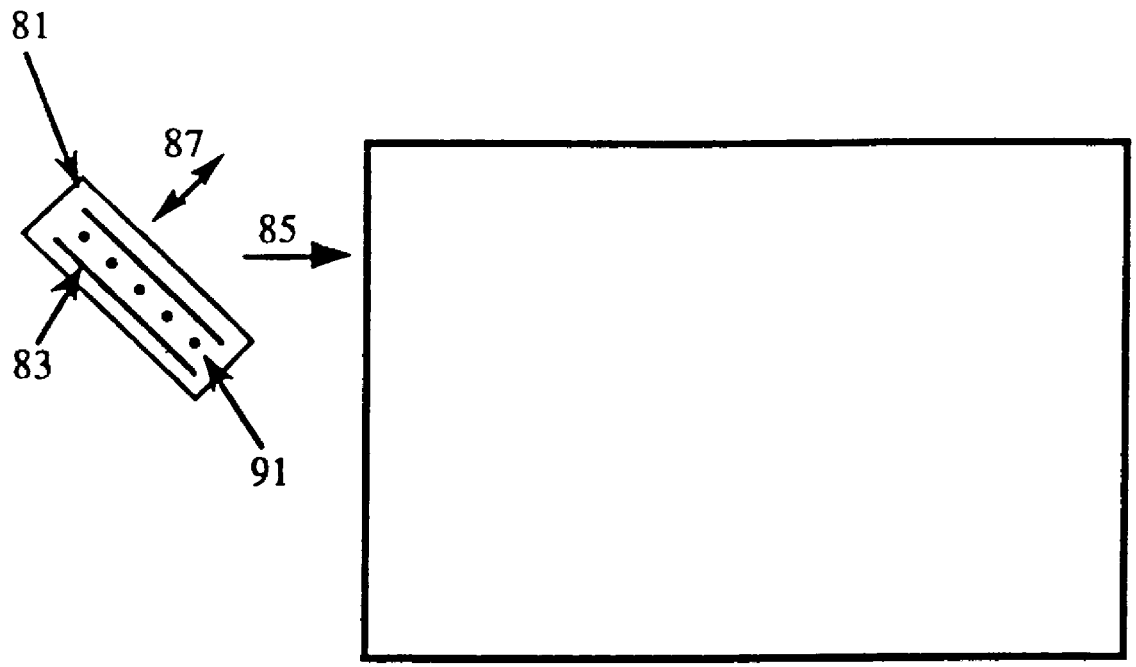
FIGS. 8(A) and 8(B) show an exemplary three dimensional printing pattern using an array of proportionally deflected jets. where the array is disposed at an angle with respect to the direction of fast scan of the printhead.
Figure 8B:
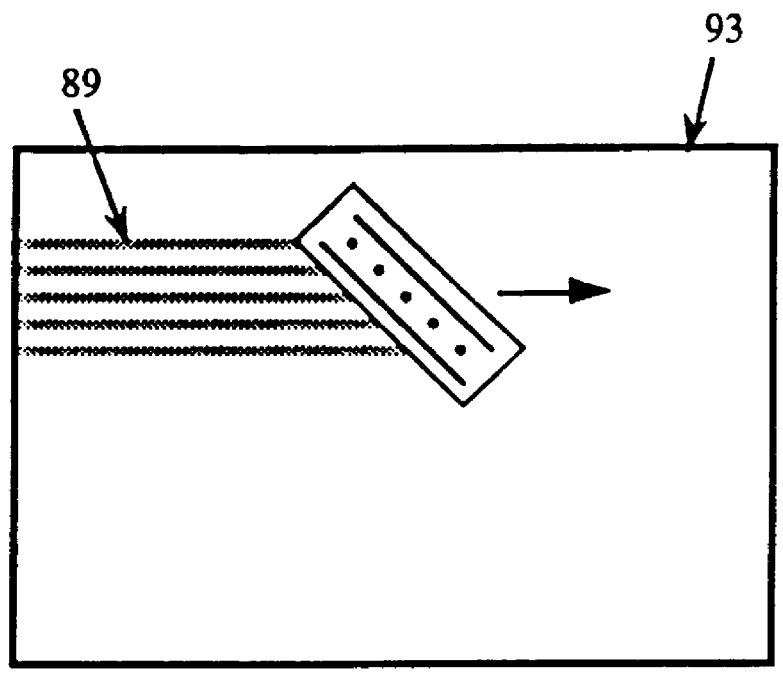

Other configurations of arrays of proportionally deflected jets are possible. FIG. 8(A), for example, shows a printhead structure 81 having an array of five jets 91 which is mounted at an angle with respect to the fast axis of scanning. The advantage of such an approach is that it eliminates the need for a high voltage deflection plate to be disposed between each nozzle. Rather, a single set of plates 83 can serve all nozzles and cause a deflection indicated by arrow 87 which is perpendicular to this set of plates. This deflection is at an angle, typically 45 degrees, with respect to the direction of fast axis scan indicated by arrow 85. The deflection thus has a vectorial component which is perpendicular to the direction of fast axis scan and, therefore, by appropriate computation can be set up to create a wide variety of patterns. FIG. 8(B) shows the printhead 81 as it scans across a print area 93 leaving binder print tracks 89. A further advantage of this approach is that the jets in the array can be relatively closely spaced and, therefore, fewer interlaced scanning lines (and, in some cases no interlaced scan lines) would be needed to cover the entire print area than would be needed, for example, in the arrangement shown in FIGS. 7(A), 7(B) and 7(C).

Figure 9A:
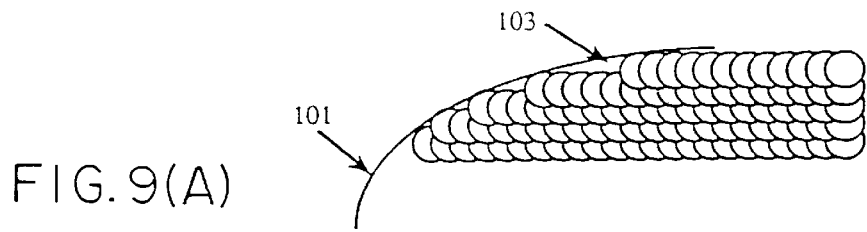
FIGS. 9(A), 9(B) and 9(C) show exemplary results when using proportional deflection techniques to create various edge contours of components.

One effective application of the aspect of the invention is to use proportional deflection in order to create smooth edges on components. FIG. 9(A) shows the edge definition that would be obtained using an on-off printhead, (i.e., without proportional deflection) with a droplet spacing of 50 microns in both directions. It should be noted that in attempting to create the part contour 101, the attainable resolution of droplet placement causes significant steps, or discontinuous 103 to appear in the edges of the part.

Figure 9B:
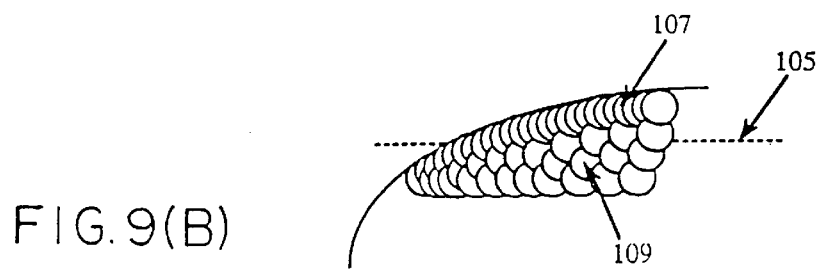
Figure 9C:
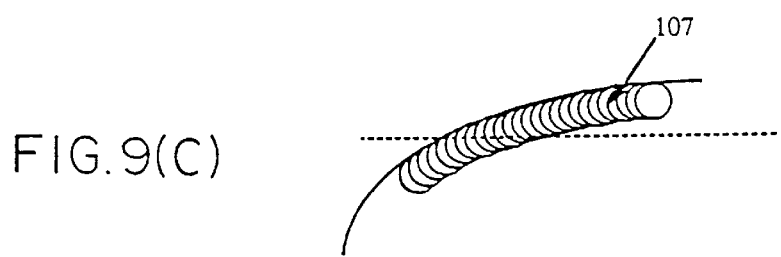

FIG. 9(B) shows a smooth edge that can be created using proportional deflection techniques. In this case a single scan line 105 is shown. It should be noted that the spacing of droplets along the scan line is smaller in the proportionally deflected case of FIG. 9(B) than in the on-off case of FIG. 9(A). Some of the droplets 107 are used to create the smooth edge contour itself, while some of the droplets 109 are used to fill in the area of the binder print line defined by one pass of the jet. For clarity, FIG. 9(C) shows only those droplets 107 which have been used to create the smooth edge contour.

Figure 10A:
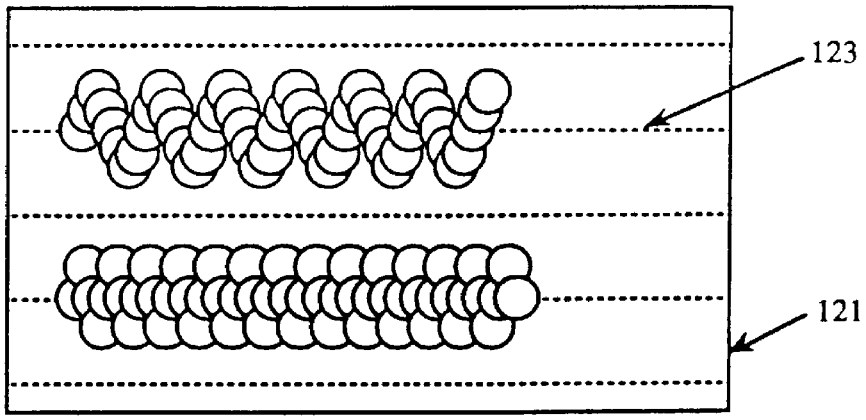
FIGS. 10(A), 10(B) and 10(C) show exemplary patterns created using proportional deflection techniques to define various interior structures of components.
Figure 10B:
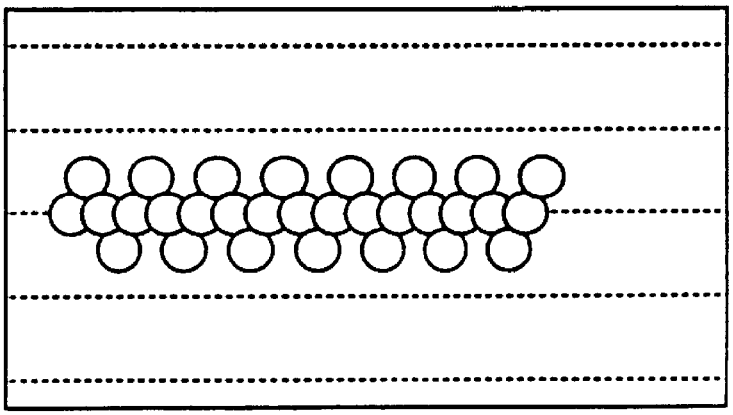
Figure 10C:
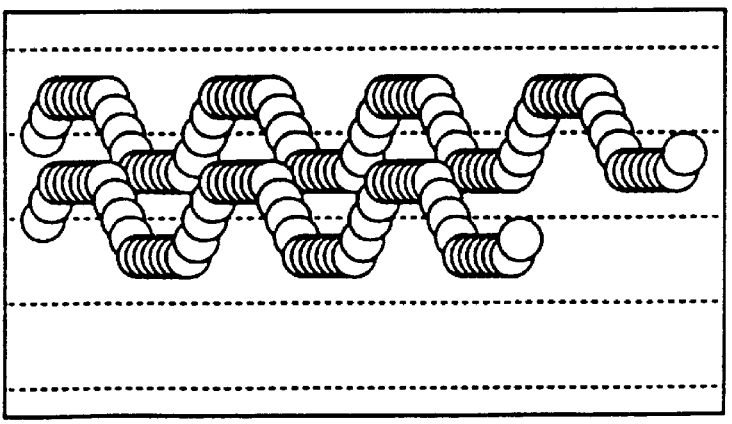

Another application of the invention is to use proportional deflection to create desired patterns and properties within the interior of the body of a component. FIG. 10(A) shows two different patterns that may be created within the body of a component by using proportional deflection to position the droplets. The patterns are each created around scan lines 123 within the printing area 121. It should be noted that no reduction in printing speed is needed to accomplish this droplet placement when using proportional deflection. Some patterns may be useful for creating deliberately isotropic properties within the component, while other patterns may be useful for creating deliberately anisotropic properties within the component. The degree of proportional deflection may even be selected by a random number generator to create unique part properties. FIG. 10(B) shows a pattern which utilizes relatively little overlap between adjacent droplets of a layer. Such patterns are useful when considering that the part is actually three dimensional and thus successive layers also display overlapped characteristics. Thus, it may be desired to minimize the overlap within a layer and to make use of greater overlap between layers to create certain desired properties of the part. One example is to deposit the droplets in a pattern that results in a placement of the droplets in the three dimensional part in a hexagonal closely-packed lattice array. Such a lattice array is familiar in the art of crystallography as an array which produces the highest packing of uniform sized spheres. The use of such a lattice array would be useful in creating parts with isotropic properties based on overlap in all three dimensions of the part. Further, it is possible to create parts that have no overlap between printed droplets within a plane, or layer, but which relies on the overlap between planes or layers to define a component. FIG. 10(C) shows a pattern that can be used to create a cellular structure within a component. In FIG. 10(C) the proper relationship between two adjacent lines of proportionally deflected droplets defines the cellular pattern within the component.

One problem that can arise when using continuous jet printheads is that certain changes in the binder stream over time can cause inaccuracies in the placement of droplets. These changes can be of two types. First of all, changes in the direction of the jet as it exits the nozzle can cause different landing positions of the droplets. Secondly, even if there is no change in the direction of the emerging jet, changes in the exit velocity of the stream can also cause changes in the landing position of droplets. This is because there is typically a 2 cm distance between the exit from the nozzle tip and the impact point on the porous bed. Also, typically the downward velocity of the jet is 10 m/sec and the lateral velocity is 2 m/sec. Thus, the droplet follows a trajectory where it impacts the powder bed at an angle and a change in the jet exit velocity will change the distance "downstream" that the droplet impacts. Accordingly, one aspect of the invention is to measure changes in both the stream angular position and the stream velocity, on-line in the machine, and to take corrective action based on these measurements so as to maintain overall drop placement accuracy.

Changes in jet position, i.e., the angular position of the jet stream, can be measured using optical techniques. For example, two CCD line cameras 141,143, can be used to image the position of the stream, i.e., the jet position in two orthogonal directions, either when the printhead is at rest or when it is in motion, so that changes therein can be measured. In a three dimensional printing machine, such measurements might be taken while the machine is spreading the next layer of porous material. Changes in the stream velocity can be measured using any one of a variety of methods of flow rate measurement, e.g., including the measurement of pressure drop through a known restriction, and other techniques.

Figure 11:
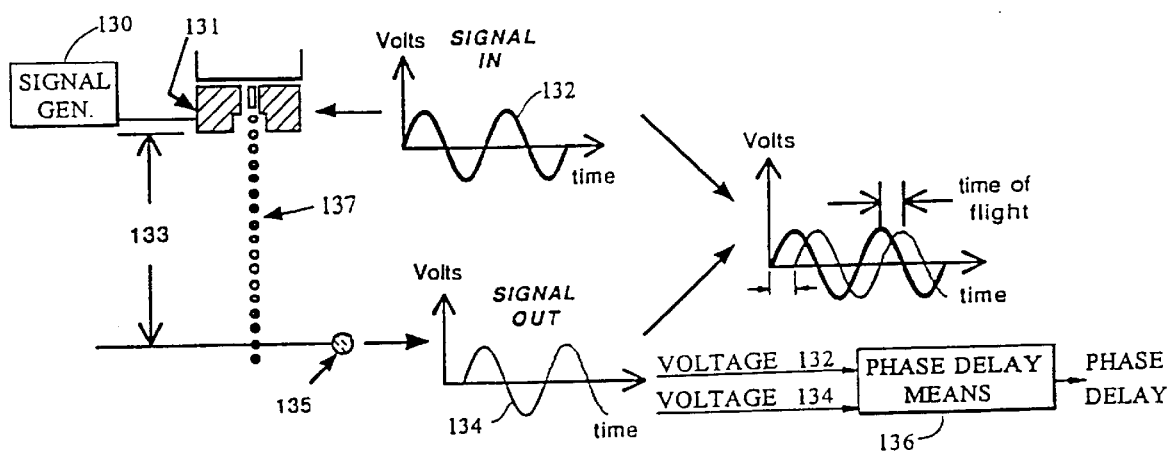
FIG. 11 shows an exemplary structure for making time of flight measurements with a continuous-jet printhead, together with exemplary voltage waveforms used therefor.

One particularly useful method in accordance with the invention is to directly measure changes in the time of flight of the droplets, that is the time between the moment of detachment from the stream and the moment of impact at the powder surface as illustrated in FIG. 11. The time of flight is the true parameter of interest (as opposed to the stream velocity) because the time of flight takes into account deceleration of the droplets as they for travel to the powder. The time of flight may be measured by using a voltage means, such as signal generator 130, for imposing a regular varying, or periodic, voltage 132, such as a sinusoidal voltage, at the charging cell 131 of a continuous-jet printhead, thereby imposing a sinusoidally varying charge on successive droplets 137. A wire or other conductive body 135, is appropriately carried by the printhead or is otherwise suitably positioned, at the level of the porous bed at a distance 133 from charging cell 131. The wire 135 acts as a capacitive pickup means and yields a sinusoidally varying voltage 134 which has a phase delay with respect to the sinusoidally varying voltage imposed at the charging cell 131. This phase delay can be determined using a suitable phase delay measuring means 136 and may be used to provide a measurement of the time of flight. Typically, for a stream with an exit velocity of 10 m/sec and a droplet generation rate of 60 kilohertz and a flight distance of 2 cm, the imposed sinusoidally varying voltage has a frequency between 200 and 1000 Hertz.

The measurement of time of flight, or any measurement of velocity, can be used to adjust the time of flight or velocity in a closed loop control system by modulation of the pressure driving the jet. For example, if the measured time of flight is higher than the desired time of flight, the pressure can be increased so to increase the jet velocity and decrease the time of flight. However, it will be understood that typically in a multiple nozzle printhead, no separate adjustment is possible for each of the velocities of the many jets and, hence, only the average velocity is used for such adjustments in a closed loop fashion.

The measurements of changes in jet position and either jet velocity or time of flight, as discussed above, must be used to correct for the accurate drop placement of each jet individually as no one correction will account for all the separate changes of the jets. The measurement of changes in jet position can be combined with a measurement in the change of time of flight by recognizing that an increase in the time of flight means that the droplet will travel further along the direction of fast scan of the raster before impacting on the powder bed. For example, if the time of flight is 2.0 msec and the fast axis scan speed is 1.0 m/s, the droplets will move 2 mm along the direction of fast scan of the raster as they fly from the point of detachment from the continuous-jet to the powder surface. If the time of flight should increase to 2.1 msec, there will be a shift in droplet landing position of 0.1 mm. This shift is functionally equivalent to a shift of 0.1 mm which would result from a change in the angular position of the jet. Thus, knowing the change in time of flight and the printhead traverse speed, the effect of the change in time of flight can be added to the measured change in jet position. These position changes may now be corrected for.

When the position of a jet changes so that the impact point moves along the direction of fast scan, the release point can be adjusted so that the impact takes place at the intended spot. This is accomplished by electronically advancing or retarding by the controller 62 the information in the data file 147 that defines the component model which information is supplied to the printhead as it travels along the direction of fast scan. For example, if the projected impact is further down the fast scan than desired, the information can be electronically advanced so that the actual impact is as desired. Referring to FIG. 7, when the position of a jet changes so that the impact point moves lateral to the direction of fast scan, the degree of proportional deflection may be changed by electronic control so as to cause the true impact at the desired location. Thus, by the combination of advancing/retarding information to the printhead and changing the amount of proportional deflection, the measured jet position and time of flight can be used to provide corrective actions to maintain drop placement accuracy.

While the particular embodiments of the invention represent preferred embodiments thereof, modifications may occur to those in the art within the spirit and scope of the invention. Hence, the invention is not to be construed as limited to the particular embodiments described herein, except as defined by the appended claims.

What is claimed is:

1. A system for producing a three dimensional component by bonding together successive layers of a porous material with droplets of a binder material, said system comprising:

a binder printhead having an array of nozzles for supplying jets of binder material droplets to selected regions of layers of porous material;

means for controlling the supplying of said jets of droplets;

means for moving said printhead in a raster scan fashion over a layer of said porous material so that during each scan said printhead is moved along a fast-scan axis in at least one direction to provide a plurality of fast-scanning paths for supplying said droplets to said layer of said porous material;

wherein said controlling means controls the supplying of droplets so as to variably deflect said droplets which are supplied from said array of nozzles in a direction having a component which is perpendicular to said fast-scanning paths so that the deflection thereof is large enough to cover substantially a distance between adjacent ones of the fast-scanning paths of said droplets so that a selected region of said layer of porous material can be completely covered by said droplets;

said controlling means further controls the variable deflection of said droplets on to the layer of porous material at which edges of the component are to be formed so that positions of said droplets on said layer provide smooth surface contours at said edges; and means for making measurements of changes in times of flight of said droplets from the time at which they are formed at the nozzles of the array to the time at which they impact onto the porous material, the controlling means responding to the measurements to control the placements of said droplets on the porous material, and means for making measurements including:

means for charging said droplets as they are formed;

means for imposing a periodic voltage on said charging means to produce charges on said droplets as they are formed;

means for detecting a signal representative of a periodic charge on said droplets at a level of said layer of porous material; and means for determining a phase delay between the periodic voltage imposed on said charging means and the periodic charge on the droplets to provide a measurement of the time of flight of said droplets.

2. a system for producing a three dimensional component by bonding together successive layers of a porous material with droplets of a binder material, said system comprising:

a binder printhead having an array of nozzles for supplying jets of binder material droplets to selected regions of said layers of porous material;

means for controlling the supplying of said jets of droplets;

means for moving said printhead in a raster scan fashion over a layer of said porous material so that during each scan said printhead is moved along a fast-scan axis in at least one direction to provide a first plurality of fast-scanning paths for supplying said droplets to said layer of said porous material;

wherein said controlling means controls the supplying of droplets so as to variably deflect said droplets which are supplied from said array of nozzles in a direction having a component which is perpendicular to said fast-scanning paths so that the deflection thereof is large enough to cover substantially a distance between adjacent ones of the fast-scanning paths of said droplets so that a selected region of said layer of porous material can be completely covered by said droplets;

said controlling means further controls the variable deflection of said droplets on to the layers of porous material at which interior portions of the component are to be formed so that positions of said droplets on said layers provide a selected pattern of bonded porous material within the interior portions of the component; and means for making measurements of changes in times of flight of said droplets from the time at which they are formed at the nozzles of the array to the time at which they impact onto the porous material, the controlling means responding to the measurements to control the placements of said droplets on the porous material, said means for making measurements including:

means for charging said droplets as they are formed;

means for imposing a periodic voltage on said charging means to produce charges on said droplets as they are formed;

means for detecting a signal representative of a periodic charge on said droplets at a level of said layer of porous material; and means for determining a phase delay between the periodic voltage imposed on said charging means and the periodic charge on the droplets to provide a measurement of the time of flight of said droplets.

3. A system in accordance with claim 2 wherein said controlling means controls the positions of said droplets so as to produce an isotropic pattern within interior portions of said component.

4. A system in accordance with claim 2 wherein said controlling means controls the positions of said droplets so as to produce an anisotropic pattern within interior portions of said component.

5. A system in accordance with claim 2 wherein the controlling means controls the positions of said droplets so as to produce a cellular structure within an interior of said component.

6. A system in accordance with claim 2 wherein the controlling means controls the positions of said droplets so as to produce substantially little or no overlapping of droplets in the layers of said porous material and to produce overlapping of droplets in a direction perpendicular to planes of the layers of said porous material.

7. A system in accordance with claims 1 or 2, further comprising means for making measurements of changes in positions of said droplets, said controlling means also responding to measurements measured by said means for making measurements of changes in positions to control the placements of said droplets on said porous material.

8. A system in accordance with claims 1 or 2 wherein said system includes a data file which defines a model of said component and said controlling means controls the supplying of said droplets in accordance with information supplied to said controlling means from said data file and in accordance with variable deflections of said droplets from said nozzles, said controlling means responding to measurements measured by said means for making measurements to advance or retard the supplying of said information from said data file and to control said variable deflections to control the placements of said droplets on said porous material.

9. A system for measuring the times of flight of droplets from an ink jet printhead to a material, said system comprising:
a printhead having a nozzle for supplying a jet of droplets to selected regions of said material;
means for controlling the supplying of said jet of droplets;
means for providing relative motion between said printhead and said material; and
means for making measurements of changes in times of flight of said droplets from the time at which they are formed at the nozzle to the time at which they impact onto the material, the controlling means responding to measurements measured by said means for making measurements to control the placements of said droplets on the material, said means for making measurements including:
means for charging said droplets as they are formed;
means for imposing a periodic voltage on said charging means to produce charges on said droplets as they are formed;
means for detecting a signal representative of a periodic charge on said droplets at a predetermined point along a flight path; and
means for determining a phase delay between the periodic voltage imposed on said charging means and the periodic charge on said droplets at the predetermined point along the flight path to provide a measurement of the time of flight of said droplets.

10. A system for producing a three dimensional component by bonding together successive layers of a porous material with droplets of a binder material, the system comprising:
a binder printhead having an array of nozzles for supplying jets of binder material droplets to selected regions of layers of porous material;
means for moving the printhead in a raster scan fashion over a layer of the porous material so that during each scan the printhead is moved along a fast-scan axis in at least one direction to provide a plurality of fast-scanning paths for supplying the droplets to the layer of the porous material; and
means for controlling the supplying of the jets of droplets to variably deflect the supplied droplets in a direction having a component which is perpendicular to the fast-scanning paths on to the successive layers of porous material at which interior portions of the component are to be formed so that the positions of the droplets on the successive layers provide a selected three-dimensional pattern of bonded porous material within the interior portions of the component.

11. The system in accordance with claim 10, wherein the controlling means controls the positions of the droplets so as to produce an isotropic pattern within interior portions of the component.

12. The system in accordance with claim 10, wherein the controlling means controls the positions of the droplets so as to produce an anisotropic pattern within interior portions of the component.

13. The system in accordance with claim 10, wherein the controlling means controls the positions of the droplets so as to produce a cellular structure within an interior of said component.

14. The system in accordance with claim 10, wherein the controlling means controls the positions of the droplets so as to produce substantially little or no overlapping of droplets in a first layer of the porous material and to position droplets in an adjacent layer over areas with little or no overlapping in said first layer.

15. The system of claim 14, wherein said means for moving said printhead is operative to subsequently move said printhead along said fast-scan axis to provide at least a second plurality of fast-scanning paths of said droplets which are interlaced with said plurality of fast-scanning paths.

16. A system in accordance with claim 14 further comprising deflection plates oriented to produce an electric field which has a component perpendicular to the direction of said fast-scan axis to produce the variable deflection.

17. A system for producing a three dimensional component by bonding together successive layers of a porous material with droplets of a binder material, the system comprising:
a binder printhead having an array of nozzles for supplying jets of binder material droplets to selected regions of layers of porous material;
means for moving the printhead in a raster scan fashion over a layer of the porous material so that during each scan the printhead is moved along a fast-scan axis in at least one direction to provide a plurality of fast-scanning paths for supplying the droplets to the layer of the porous material; and
means for controlling the supplying of the jets of droplets to variably deflect the supplied droplets in a direction having a component which is perpendicular to the fast-scanning paths on to the successive layers of porous material at which edges of the component are to be formed so that the positions of the droplets on the successive layers provide three-dimensional surface contours.

18. The system of claim 17, wherein said means for moving said printhead is operative to subsequently move said printhead along said fast-scan axis to provide at least a second plurality of fast-scanning paths of said droplets which are interlaced with said plurality of fast-scanning paths.

19. A system in accordance with claim 17 further comprising deflection plates oriented to produce an electric field which has a component perpendicular to the direction of said fast-scan axis to produce the variable deflection.

20. A system for producing a three dimensional component by bonding together successive layers of a porous material with droplets of a binder material, the system comprising:
   a binder printhead having an array of nozzles for supplying jets of binder material droplets to selected regions of the layers of porous material, the binder printhead mounted for movement in a raster scan fashion over a layer of the porous material;
   a controller in communication with the binder printhead for controlling the movement of the binder printhead and the supplying of the jets of droplets;
   the controller including instructions for moving the printhead in a raster scan fashion over a layer of the porous material so that during each scan the printhead is moved along a fast-scan axis in at least one direction to provide a plurality of fast-scanning paths for supplying the droplets to the layer of the porous material; and
   the controller including further instructions for variably deflecting the droplets which are supplied from the array of nozzles in a direction having a component which is perpendicular to the fast-scanning paths to create a preselected three dimensional interior pattern of bonded material within the three dimensional component.

21. The system of claim 20, wherein the further instructions to create a preselected interior pattern include an instruction for producing an isotropic pattern.

22. The system of claim 20, wherein the further instructions to create a preselected interior pattern include an instruction for producing an anisotropic pattern.

23. The system of claim 20, wherein the further instructions to create a preselected interior pattern include an instruction for producing a cellular structure.

24. The system of claim 20, wherein the further instructions to create a preselected interior pattern include an instruction for producing substantially little or no overlapping of droplets in a first layer of the porous material and to position droplets in an adjacent layer over areas with little or no overlapping in said first layer.

25. The system of claim 20, wherein the controller further includes instructions for moving said printhead subsequently along said fast-scan axis to provide at least a second plurality of fast-scanning paths of said droplets which are interlaced with said plurality of fast-scanning paths.

26. A system in accordance with claim 20 further comprising deflection plates oriented to produce an electric field which has a component perpendicular to the direction of said fast-scan axis to produce the variable deflection.

27. A system for producing a three dimensional component by bonding together successive layers of a porous material with droplets of a binder material, the system comprising:
   a binder printhead having an array of nozzles for supplying jets of binder material droplets to selected regions of the layers of porous material, the binder printhead mounted for movement in a raster scan fashion over a layer of the porous material;
   a controller in communication with the binder printhead for controlling the movement of the binder printhead and the supplying of the jets of droplets;
   the controller including instructions for moving the printhead in a raster scan fashion over a layer of the porous material so that during each scan the printhead is moved along a fast-scan axis in at least one direction to provide a plurality of fast-scanning paths for supplying the droplets to the layer of the porous material; and
   the controller including further instructions for variably deflecting the droplets which are supplied from the array of nozzles in a direction having a component which is perpendicular to the fast-scanning paths to create a three dimensional surface contour of the three dimensional component.

28. The system of claim 27, wherein said controller further comprises instructions for moving said printhead subsequently along said fast-scan axis to provide at least a second plurality of fast-scanning paths of said droplets which are interlaced with said plurality of fast-scanning paths.

29. A system in accordance with claim 27 further comprising deflection plates oriented to produce an electric field which has a component perpendicular to the direction of said fast-scan axis to produce the variable deflection.

30. A system for producing a three dimensional component by bonding together successive layers of a porous material with droplets of a binder material, said system comprising:
   a binder printhead having an array of nozzles for supplying jets of binder material droplets to selected regions of said layers of porous material;
   means for controlling the supplying of said jets of droplets;
   means for moving said printhead in a raster scan fashion over a layer of said porous material so that said printhead is moved along a fast-scan axis to provide a plurality of fast-scanning paths for supplying said droplets to said layer of porous material; and
   wherein said controlling means controls the supplying of droplets to variably deflect said droplets which are supplied from said array of nozzles in a direction having a component which is perpendicular to said fast-scanning paths; and
   first means for making measurements of changes in positions of said droplets; and
   second means for making measurements in times of flight of said droplets from the time at which they are formed at the nozzles of the array to the time at which they impact onto the porous material,
   the controlling means responding to measurements measured by said first and second means for making measurements to control placement of said droplets on the porous material to maintain drop placement accuracy.

31. A system in accordance with claim 30, wherein said system includes a data file which defines a model of said component and said controlling means controls the supplying of said droplets in accordance with information supplied to said controlling means from said data file, said controlling means responding to changes in positions measurements measured by said first means for making measurements and time of flight measurements measured by said second means for making measurements to advance or retard the supplying of said information from said data file to control the placement of said droplets on said porous material.

32. A system in accordance with claim 30 wherein said controlling means responds to changes in position measurements measured by said first means for making measurements to control said variable deflections to control the placement of said droplets on said porous material.

33. The system of claim 30, said second means for making measurements of changes in times of flight further comprising:

means for charging said droplets as they are formed;

means for imposing a periodic voltage on said charging means to produce charges on said droplets as they are formed;

means for detecting a signal representative of a periodic charge on said droplets at a predetermined point along a flight path; and means for determining a phase delay between the periodic voltage imposed on said charging means and the periodic charge on said droplets at the predetermined point along the flight path to provide a measurement of the time of flight of said droplets.

34. A system in accordance with claim 33, wherein said means for imposing a periodic voltage imposes a sinusoidally varying voltage signal on said charging means.

35. A system in accordance with claim 33, wherein said means for detecting a signal representative of a periodic charge on said droplets at a predetermined point along the flight path further comprises means for detecting said signal at a level of said porous material.

36. The system of claim 30, further comprising means for moving said printhead subsequently along said fast-scan axis to provide at least a second plurality of fast-scanning paths of said droplets which are interlaced with said plurality of fast-scanning paths.

37. A system in accordance with claim 30, wherein said array of nozzles is a linear array thereof which is arranged so as to be perpendicular to the direction of said fast-scan axis and further including a plurality of deflection plates, each of said nozzles being positioned between a pair of said deflection plates.

38. A system in accordance with claim 37, wherein the distance separating said nozzles in said linear array is substantially large than the diameter of said nozzles.

39. A system in accordance with claim 30, wherein said controlling means controls the variable deflection of said droplets on to the layer of porous material at which edges of the component are to be formed so that positions of said droplets on said layer provide smooth surface contours at said edges.

40. A system in accordance with claim 30, wherein said controlling means controls the variable deflection of said droplets on to the layers of porous material at which interior portions of the component are to be formed so that positions of droplets on said layers provide a selected pattern of said bonded porous material within an interior of the component.

41. The system in accordance with claim 40, wherein the controlling means controls the positions of the droplets so as to produce an isotropic pattern within interior portions of the component.

42. The system in accordance with claim 40, wherein the controlling means controls the positions of the droplets so as to produce an anisotropic pattern within interior portions of the component.

43. The system in accordance with claim 40, wherein the controlling means controls the positions of the droplets so as to produce a cellular structure within an interior of said component.

44. The system in accordance with claim 40, wherein the controlling means controls the positions of the droplets so as to produce substantially little or no overlapping of droplets in a first layer of the porous material and to position droplets in an adjacent layer over areas with little or no overlapping in said first layer.

* * * * *

UNITED STATES PATENT AND TRADEMARK OFFICE
CERTIFICATE OF CORRECTION

PATENT NO. : 5,807,437
DATED : Sept. 15, 1998
INVENTOR(S) : Sachs et al.

It is certified that error appears in the above-identified patent and that said Letters Patent is hereby corrected as shown below:

Column 1, before the Field of Invention section, insert:

--GOVERNMENT RIGHTS
This invention was made with government support under Grant Number DDM-9215728 awarded by the National Science Foundation. The government has certain rights in the invention.--

Claim 1, column 9, line 66, replace "and" with --said-- to read:
--placements of said droplets on the porous material, said--

Claim 38, column 16, line 3, replace "large" with --larger-- to read:
--substantially larger than the diameter of said nozzles.--

Claim 43, column 16, line 26, replace "an interior" with --interior portions-- to read:
--to produce a cellular structure within interior portions of said--

Signed and Sealed this

Twenty-fifth Day of April, 2000

*Attest:*

Q. TODD DICKINSON

*Attesting Officer*     Director of Patents and Trademarks